(12) United States Patent
Robichon

(10) Patent No.: US 12,482,966 B2
(45) Date of Patent: Nov. 25, 2025

(54) ELECTRICAL CONNECTION MODULE AND AUTOMOTIVE LIGHTING DEVICE

(71) Applicant: VALEO VISION, Bobigny (FR)

(72) Inventor: Mathieu Robichon, Angers (FR)

(73) Assignee: VALEO VISION, Bobigny (FR)

( * ) Notice: Subject to any disclaimer, the term of this patent is extended or adjusted under 35 U.S.C. 154(b) by 254 days.

(21) Appl. No.: 18/254,478

(22) PCT Filed: Nov. 22, 2021

(86) PCT No.: PCT/EP2021/082431
§ 371 (c)(1),
(2) Date: May 25, 2023

(87) PCT Pub. No.: WO2022/112148
PCT Pub. Date: Jun. 2, 2022

(65) Prior Publication Data
US 2024/0063560 A1     Feb. 22, 2024

(30) Foreign Application Priority Data
Nov. 30, 2020  (FR) ...................................... 20 12375

(51) Int. Cl.
*H01R 12/70*    (2011.01)
*F21S 41/19*    (2018.01)
*H01R 12/72*    (2011.01)

(52) U.S. Cl.
CPC ........ *H01R 12/7023* (2013.01); *F21S 41/192* (2018.01); *H01R 12/721* (2013.01)

(58) Field of Classification Search
CPC .. H01R 12/7023; H01R 12/721; F21S 41/192
(Continued)

(56) References Cited

U.S. PATENT DOCUMENTS

| 4,521,065 A | * | 6/1985 | Nestor | H01R 12/721 |
| | | | | 439/328 |
| 5,777,855 A | * | 7/1998 | Yokajty | H01R 12/62 |
| | | | | 361/803 |

(Continued)

FOREIGN PATENT DOCUMENTS

| CN | 109155488 A | * | 1/2019 | ........... H01R 13/629 |
| DE | 102018132405 A1 | * | 6/2020 | ............. H05K 3/326 |

(Continued)

OTHER PUBLICATIONS

Office Action issued Jul. 2, 2024, in corresponding Japanese Patent Application No. 2023-532769 (English Translation only), 3 pages.

(Continued)

*Primary Examiner* — Peter G Leigh
(74) *Attorney, Agent, or Firm* — Oblon, McClelland, Maier & Neustadt, L.L.P.

(57) ABSTRACT

An electrical connection module for an automotive vehicle includes a printed circuit board with a retainer portion and an edge connector configured to be connected to the printed circuit board. The retainer portion includes an electric connection located in a recess of the printed circuit board, and the edge connector includes jaws intended to be coupled with the electric connection when entering the recess. The edge connector further includes a back portion from which the electric arm and the support arm protrude. The retainer portion includes two retaining arms, each retaining arm protruding from the printed circuit board towards the electric connection in a protruding direction which forms between 5 and 40 degrees with respect to the connection direction and leaving a space between them which is smaller than the width of the back portion of the edge connector.

20 Claims, 3 Drawing Sheets

(58) Field of Classification Search
USPC .......................................................... 439/366
See application file for complete search history.

(56) References Cited

U.S. PATENT DOCUMENTS

| | | | | |
|---|---|---|---|---|
| 5,954,536 | A * | 9/1999 | Fuerst ..................... | H01R 12/79 |
| | | | | 439/496 |
| 7,883,369 | B1 * | 2/2011 | Sun ....................... | H01R 12/721 |
| | | | | 439/607.35 |
| 9,426,889 | B2 * | 8/2016 | Liu ......................... | H05K 3/361 |
| 10,811,795 | B2 * | 10/2020 | Roldan .............. | H01R 13/6271 |
| 11,114,788 | B2 * | 9/2021 | Kim ..................... | H01R 13/629 |
| 2009/0103275 | A1 * | 4/2009 | Liu ......................... | H05K 3/363 |
| | | | | 361/784 |
| 2018/0241141 | A1 * | 8/2018 | Roldan .................. | H05K 3/326 |
| 2019/0383455 | A1 * | 12/2019 | De-La-Fuente ..... | F21V 19/0015 |

FOREIGN PATENT DOCUMENTS

| | | | |
|---|---|---|---|
| EP | 3 367 511 A1 | 8/2018 | |
| EP | 3 671 966 A1 | 6/2020 | |
| JP | 2002056931 A * | 2/2002 | ............. H05K 1/118 |
| JP | 2016127184 A * | 7/2016 | |
| KR | 101780363 B1 * | 9/2017 | ........... H01R 12/722 |
| KR | 101882269 B1 * | 7/2018 | ............. H01R 12/71 |
| TW | 201220966 A1 | 5/2012 | |

OTHER PUBLICATIONS

Search Report issued Jun. 26, 2024, in corresponding Japanese Patent Application No. 2023-532769 (English Translation only), 22 pages.
International Search Report issued Mar. 17, 2022 in PCT/EP2021/082431 filed on Nov. 22, 2021, 3 pages.

* cited by examiner

ELECTRICAL CONNECTION MODULE AND AUTOMOTIVE LIGHTING DEVICE

This invention is related to the field of automotive lighting devices, and more particularly, to the manufacturing and assembly of these devices.

Automotive lighting devices require an increasing amount of electric connections, which are intended to provide control and power supply to the light sources contained therein.

These electric connections are usually managed in harness of wires coming from the control unit. This harness usually ends in a connector which in turn couples with the local connector in the device.

There is a specific type of connectors known as "card-edge" connectors. These connectors feature a body for connecting the wires of a wire harness. A pair of opposing jaws extends from the body and is configured to receive a connection portion of a printed circuit board supporting an electronic circuit therebetween. At least one of the jaws comprises electrical contacts, which are electrically connected to the wire harness through the connector's body. The arrangement is such that the electrical contacts located on the jaws establish contact with the corresponding connection portion of the PCB that is pinched between the jaws.

However, if the PCB is not properly inserted between the jaws of the cardedge connector, or, if either or both of the PCB and the connector are subject to vibrations or shocks during use, the connector may become disconnected from the PCB. Such an incident may only be attended to by manual intervention. This situation is particularly critical when the cardegdge connector, which has the benefit of having a small footprint, is used in a lighting module for an automotive car. Typically, physical space is a major constraint in such an environment, so that the use of a cardedge-type connector is interesting. However, an automotive vehicle is subject to vibrations or shocks, so that it becomes likely for the connector to disconnect during use. Moreover, the manual intervention required to fix the connection is often work-intensive as well as costly, because many components of the automotive vehicle may have to be removed before the connector and PCB become accessible—if they are accessible at all.

Further, there are also further constraints regarding the force needed to assemble the cardedge connector into the printed circuit board. Sometimes this connection is done manually, to ensure the success. If the system comprises a retaining element which needs a high force to be overcome and fit, manual process becomes hard and exhausting.

It is an objective of the present invention to alleviate at least some of the drawbacks found in the prior art.

The invention provides an alternative solution for improving the assembly of these devices by an electrical connection module and an automotive lighting device according to the invention. Preferred embodiments of the invention are defined in dependent claims.

Unless otherwise defined, all terms (including technical and scientific terms) used herein are to be interpreted as is customary in the art. It will be further understood that terms in common usage should also be interpreted as is customary in the relevant art and not in an idealised or overly formal sense unless expressly so defined herein.

In this text, the term "comprises" and its derivations (such as "comprising", etc.) should not be understood in an excluding sense, that is, these terms should not be interpreted as excluding the possibility that what is described and defined may include further elements, steps, etc.

In a first inventive aspect, the invention provides an electrical connection module for an automotive vehicle, comprising a printed circuit board with a retainer portion and an edge connector configured to be connected to the printed circuit board at the retainer portion following a connection direction, wherein:

the retainer portion comprises an electric connection located in a recess of the printed circuit board;

the edge connector comprises an electric jaw with electric terminals intended to be coupled with the electric connection when entering the recess;

the edge connector further comprises a support jaw intended to contact the retainer portion at the opposite side of the electric connection;

the edge connector further comprises a back portion, where the electric arm and the support arm protrude from; and the retainer portion comprises two retaining arms, each retaining arm protruding from the printed circuit board towards the electric connection in a protruding direction which forms between 5 and 40 degrees with respect to the connection direction, and leaving a space between them which is smaller than the width of the back portion of the edge connector.

The edge connector has two jaws which are intended to couple to the printed circuit board, leaving the electric connection between them, as all edge connectors usually do. To do so, the edge connector is introduced between the retaining arms, which create a path for the edge connector to be coupled to the electric connection of the printed circuit board. Further, since the space is smaller than the width of the edge connector, the arms are bended to allow the edge connector enter between them and then come back to the original position becoming an abutment to keep the edge connector in position.

In some particular embodiments, each retaining arm has a first end connected to the printed circuit board and a second end which is free and is directed towards the electric connection, so that each retaining arm may be flexed like a cantilever beam with respect to the first end.

This flexing movement is intended to create the minimum effort possible to the manufacturer, so that with a slight pressure, the edge connector may be put into place and secured.

In some particular embodiments, the electrical connection module further comprises a circular recess in the first end of each retaining arm. In some particular embodiments, the circular recess has a diameter which is at least twice the width of the retaining arm.

This circular recess improves the flexibility in the bending movement of the retaining arms.

In some particular embodiments, the two retaining arms are arranged symmetrically with respect to a plane perpendicular to the printed circuit board surface and containing the connection direction.

This symmetrical arrangement distributes the assembly effort optimally.

In some particular embodiments, each retaining arm protruding from the printed circuit board towards the electric connection in a protruding direction which forms between 10 and 30 degrees with respect to the connection direction.

This particular angular range reduces the necessary effort for assembling the edge connector into the printed circuit board to approximately 15 N, which may be accomplished by a single finger.

In some particular embodiments, each retaining arm has a length and a width, wherein the length is comprised between 5 and 15 times the width.

This ratio is advantageous since it allows an optimal endurance of the retaining arm against breakage.

In some particular embodiments, the retainer portion is reinforced with respect of the remainder of the printed circuit board.

In a second inventive aspect, the invention provides an automotive lighting device comprising:
- an electrical connection module according to the first inventive aspect; and
- a plurality of solid-state light sources installed in the printed circuit board.

The term "solid state" refers to light emitted by solid-state electroluminescence, which uses semiconductors to convert electricity into light. Compared to incandescent lighting, solid state lighting creates visible light with reduced heat generation and less energy dissipation. The typically small mass of a solid-state electronic lighting device provides for greater resistance to shock and vibration compared to brittle glass tubes/bulbs and long, thin filament wires. They also eliminate filament evaporation, potentially increasing the lifespan of the illumination device. Some examples of these types of lighting comprise semiconductor light-emitting diodes (LEDs), organic light-emitting diodes (OLED), or polymer light-emitting diodes (PLED) as sources of illumination rather than electrical filaments, plasma or gas.

Figure 1:
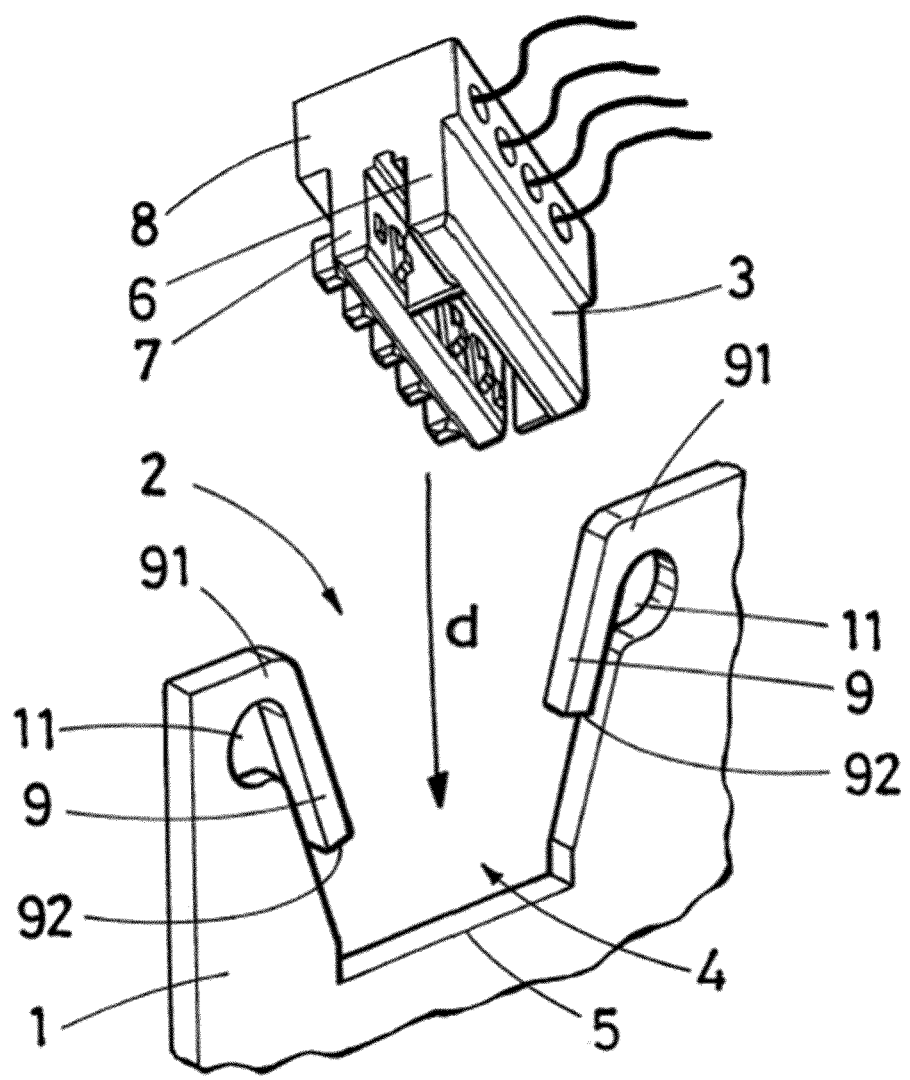
FIG. 1 shows a general perspective view of an electric connection module according to the invention.

In these figures, the following reference numbers have been used:
1 Printed circuit board
2 Retainer portion
3 Card edge connector
4 Recess
5 Electric connection
6 First jaw
7 Second jaw
8 Back portion
9 Retaining arm
91 First end of the retaining arm
92 Second end of the retaining arm
10 Lighting device
11 Circular recess
100 Automotive vehicle The example embodiments are described in sufficient detail to enable those of ordinary skill in the art to embody and implement the systems and processes herein described. It is important to understand that embodiments can be provided in many alternate forms and should not be construed as limited to the examples set forth herein.

Accordingly, while embodiment can be modified in various ways and take on various alternative forms, specific embodiments thereof are shown in the drawings and described in detail below as examples. There is no intent to limit to the particular forms disclosed. On the contrary, all modifications, equivalents, and alternatives falling within the scope of the appended claims should be included.

FIG. 1 shows a general perspective view of an electric connection module according to the invention.

This module comprises
- a printed circuit board 1 comprising a retainer portion 2; and
- a card edge connector 3 intended to be connected to the printed circuit board at the retainer portion 2.

The retainer portion 2 is a reinforced portion of the printed circuit board 1. It comprises a recess 4, where an electric connection 5 is located. This electric connection 5 is intended to receive the edge connector 3, and to perform an electric connection between the harness of wires managed by the edge connector 3 and the lighting elements which populate the printed circuit board 1. The connection between the edge connector 3 and the printed circuit board 1 is achieved due to the shape of the edge connector 3, which comprises two jaws 6, 7 which protrude from a back portion 8. The two jaws 6, 7 are intended to be arranged at both sides of the electric connection 5 of the printed circuit board 1. Since the jaws 6, 7 comprises electric terminals, they are intended to be coupled with the electric connection 5, thus establishing the continuity between the wire harness and the lighting elements of the printed circuit board 1.

The retainer portion comprises two retaining arms 9. Each retaining arm protrudes from the printed circuit board towards the electric connection in a protruding direction which forms 20 degrees with respect to the connection direction d, and leaving a space between them which is smaller than the width of the back portion of the edge connector.

As may be seen in this figure, each retaining arm has a first end 91 which is in the printed circuit board 1. Then, the arm protrudes towards the electric connection until a second end 92, which is free, so that each retaining arm may be flexed like a cantilever beam with respect to the first end. The two retaining arms are arranged symmetrically with respect to a plane perpendicular to the printed circuit board surface and containing the connection direction.

There is a space between the second ends of each retaining arm. This space is smaller than the back portion of the edge connector, so the edge connector must bend the retaining arms when introduced in this space.

Each retaining arm comprises a circular recess 11 which is intended to improve the flexibility of the retaining arms, by reducing the material of the printed circuit board located around this first end. This circular recess has a diameter of 3.5 mm.

Each arm has a width of 1.5 mm and a length of 10 mm, which is a good ratio to ensure flexibility and endurance.

Figure 2:
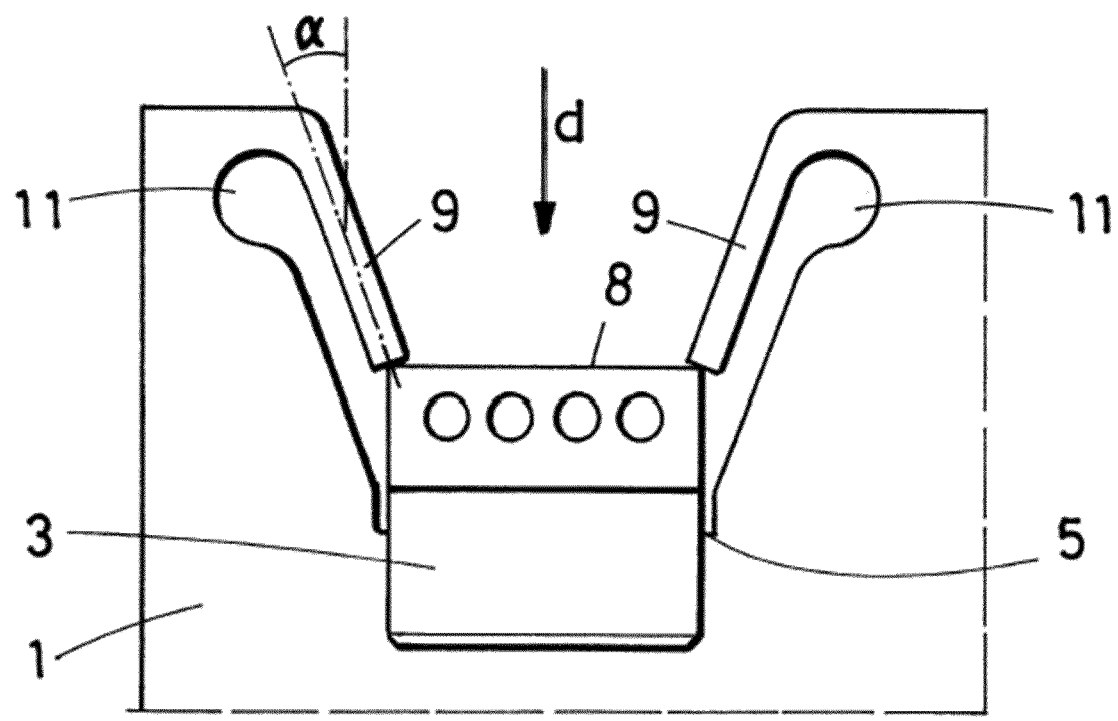
FIG. 2 shows the electric connection module of FIG. 1 once the card edge connector has been connected to the printed circuit board.

FIG. 2 shows the card edge connector 3 once it has been connected to the printed circuit board 1. The retaining arms 9, once that have been bended when the card edge connector has been introduced, has returned to their original position. Since the space between them is smaller than the width of the back portion 8 of the edge connector, when they come back to their original positions, they act as an abutment against the back portion 8 of the edge connector, thus preventing it from disconnecting from the printed circuit board 1.

Since the arms protrude towards the electric connection in a direction which forms 20 degrees with respect to the connection direction d, the force to bend the retaining arms is quite low, and the arms create a channel which guides the introduction of the edge connector towards the electric connection of the printed circuit board.

Therefore, an easy assembly and a secure position are achieved thanks to this connection.

Figure 3:
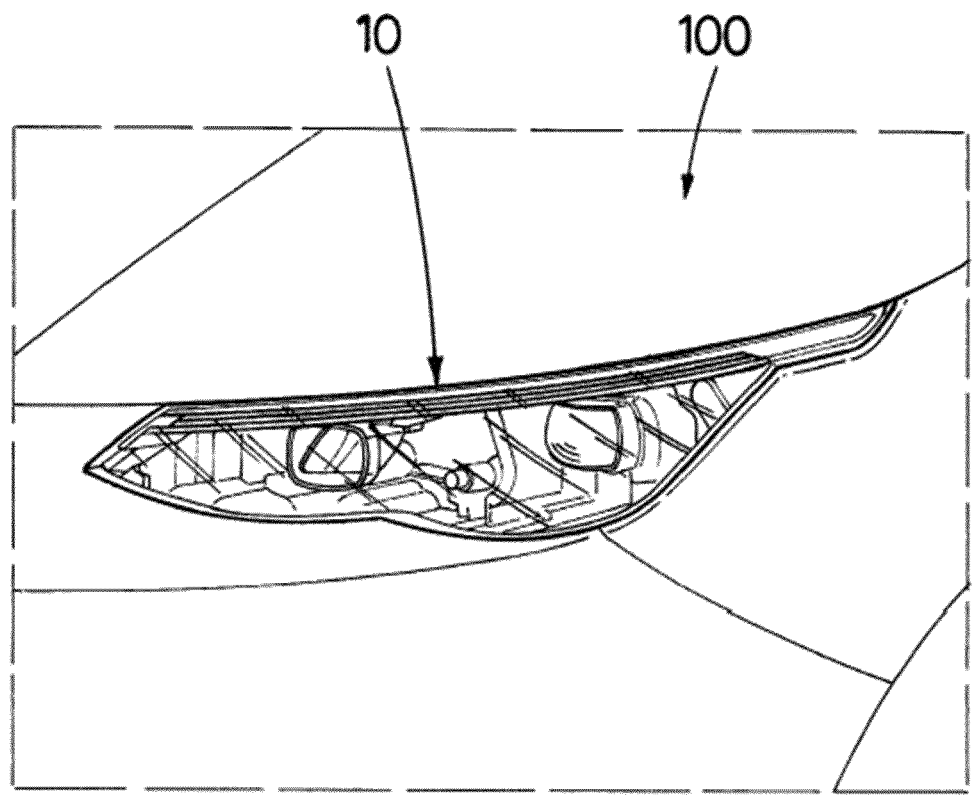
FIG. 3 shows a lighting device according to the invention.

FIG. 3 shows an automotive lighting device 10 which comprises such an electric module, installed in an automotive vehicle 100.

The invention claimed is:

1. An electrical connection module for an automotive vehicle, comprising a printed circuit board with a retainer portion and an edge connector configured to be connected to the printed circuit board at the retainer portion following a connection direction, wherein:
   the retainer portion comprises an electric connection located in a recess of the printed circuit board;
   the edge connector comprises an electric jaw with electric terminals intended to be coupled with the electric connection when entering the recess;
   the edge connector further comprises a support jaw intended to contact the retainer portion at the opposite side of the electric connection;
   the edge connector further comprises a back portion, where an electric arm and a support arm protrude from; and
   the retainer portion comprises two retaining arms, each retaining arm protruding from the printed circuit board towards the electric connection in a protruding direction which forms between 5 and 40 degrees with respect to the connection direction, and leaving a space between them which is smaller than the width of the back portion of the edge connector.

2. Electrical connection module according to claim 1, wherein each retaining arm has a first end connected to the printed circuit board and a second end which is free and is directed towards the electric connection, so that each retaining arm may be flexed like a cantilever beam with respect to the first end.

3. Electrical connection module according to claim 2, further comprising a circular recess in the first end of each retaining arm.

4. Electrical connection module according to claim 3, wherein the circular recess has a diameter which is at least twice the width of the retaining arm.

5. Electrical connection module according to claim 4, wherein the two retaining arms are arranged symmetrically with respect to a plane perpendicular to a surface of the printed circuit board and containing the connection direction.

6. Electrical connection module according to claim 3, wherein the two retaining arms are arranged symmetrically with respect to a plane perpendicular to a surface of the printed circuit board and containing the connection direction.

7. Electrical connection module according to claim 3, each retaining arm protruding from the printed circuit board towards the electric connection in a protruding direction which forms between 10 and 30 degrees with respect to the connection direction.

8. Electrical connection module according to claim 3, wherein each retaining arm has a length and a width, wherein the length is comprised between 5 and 15 times the width.

9. Electrical connection module according to claim 3, wherein the retainer portion is reinforced with respect of the remainder of the printed circuit board.

10. Automotive lighting device comprising:
    an electrical connection module according to claim 3; and
    a plurality of solid-state light sources installed in the printed circuit board.

11. Electrical connection module according to claim 2, wherein the two retaining arms are arranged symmetrically with respect to a plane perpendicular to a surface of the printed circuit board and containing the connection direction.

12. Electrical connection module according to claim 2, each retaining arm protruding from the printed circuit board towards the electric connection in a protruding direction which forms between 10 and 30 degrees with respect to the connection direction.

13. Electrical connection module according to claim 2, wherein each retaining arm has a length and a width, wherein the length is comprised between 5 and 15 times the width.

14. Electrical connection module according to claim 2, wherein the retainer portion is reinforced with respect of the remainder of the printed circuit board.

15. Automotive lighting device comprising:
    an electrical connection module according to claim 2; and
    a plurality of solid-state light sources installed in the printed circuit board.

16. Electrical connection module according to claim 1, wherein the two retaining arms are arranged symmetrically with respect to a plane perpendicular to a surface of the printed circuit board and containing the connection direction.

17. Electrical connection module according to claim 1, each retaining arm-protruding from the printed circuit board towards the electric connection in a protruding direction which forms between 10 and 30 degrees with respect to the connection direction.

18. Electrical connection module according to claim 1, wherein each retaining arm has a length and a width, wherein the length is comprised between 5 and 15 times the width.

19. Electrical connection module according to claim 1, wherein the retainer portion is reinforced with respect of the remainder of the printed circuit board.

20. Automotive lighting device comprising:
    an electrical connection module according to claim 1; and
    plurality of solid-state light sources installed in the printed circuit board.

* * * * *